(12) United States Patent
Takashima

(10) Patent No.: US 6,529,718 B1
(45) Date of Patent: Mar. 4, 2003

(54) RECEIVER WITH A SEARCH CIRCUIT

(75) Inventor: Naoto Takashima, Kawagoe (JP)

(73) Assignee: Pioneer Electric Corporation, Tokyo (JP)

( * ) Notice: Subject to any disclaimer, the term of this patent is extended or adjusted under 35 U.S.C. 154(b) by 0 days.

(21) Appl. No.: 09/359,715

(22) Filed: Jul. 23, 1999

(30) Foreign Application Priority Data

Jul. 24, 1998 (JP) ............................................ 10-209709

(51) Int. Cl.[7] ................................................ H04B 7/00
(52) U.S. Cl. .................................... 455/254; 455/232.1
(58) Field of Search ............................ 455/254, 232.1, 455/234.1, 234.2, 247.1, 226.1, 226.4, 161.1, 161.2, 161.3; 386/335

(56) References Cited

U.S. PATENT DOCUMENTS

| | | | |
|---|---|---|---|
| 4,357,712 A | * | 11/1982 | Kawakami |
| 4,538,300 A | * | 8/1985 | Richards, Jr. ............ 455/161.1 |
| 5,280,643 A | * | 1/1994 | Ishii |
| 5,465,408 A | * | 11/1995 | Sugayama et al. |
| 5,608,534 A | * | 3/1997 | Park et al. |
| 6,078,798 A | * | 6/2000 | Kobayashi |

FOREIGN PATENT DOCUMENTS

JP          6-13921       1/1994

* cited by examiner

Primary Examiner—Nguyen T. Vo
Assistant Examiner—Nghi H. Ly
(74) Attorney, Agent, or Firm—Morgan, Lewis & Bockius LLP

(57) ABSTRACT

This invention relates to a receiver with a search circuit that includes a RF-AGC circuit for gain control of a RF-AMP and for generating a control signal according to an output signal of the RF-AMP, a search circuit including a reception condition detector for generating the reception condition signal based on the output signal of a RF-AMP, a sensitivity change circuit for receiving the control signal from a RF-AGC circuit and for changing the sensitivity of the search circuit so as to compensate a loss of the reception condition signal caused by the RF-AGC circuit, and a station detector for outputting a station detection signal based on a reception condition signal and a reference signal.

7 Claims, 3 Drawing Sheets

RECEIVER WITH A SEARCH CIRCUIT

This application claims the benefit of Japanese patent application No. 10-209709, filed Jul. 24, 1998, which is hereby incorporated by reference.

BACKGROUND OF THE INVENTION

1. Field of the Invention

The present invention relates to a receiver with a search circuit for detecting stations, and more particularly, to a receiver with a circuit for controlling the sensitivity of the search circuit.

2. Description of the Related Art

A conventional receiver, such as an AM or a FM receiver, usually contains an Auto Gain Control (AGC) circuit. An AGC adjusts the output signal level of an amplifier to a specific level when the amplifier receives a strong input signal level.

Such a receiver also has a search circuit with a station detector for detecting stations. When a user activates auto search, the search circuit compares the reception level to a reference level set in the receiver. If the reception level is higher than the reference level, the receiver picks up the frequency corresponding to the reception level. On the other hand, if the reception level is lower than the reference level, the receiver does not pick up anything. A specific field strength is usually used as a reference level. Therefore, a search circuit compares the specific field strength corresponding to a reference level to a received field strength level. However, this conventional receiver has a problem known as a "miss-stop." The miss-stop occurs when the conventional receiver does not detect a desired station during an auto search operation although a station exists and has enough input signal level being supplied through the antenna.

The "miss-stop" occurs as a result of the AGC circuit. The Radio Frequency Auto Gain Control (RF-AGC) circuit generates a control signal to a Radio Frequency Amplifier (RF-AMP) based on a signal level corresponding to the received station's level. This operation causes a decrease in the output signal level of the RF-AMP. In other words, the above operation decreases the field strength level corresponding to the current frequency and the field strength levels corresponding to other frequencies received by the antenna. As a result, the search circuit cannot detect the current frequency because the field strength level is higher than the received field strength level. For instance, a "miss-stop" occurs when a receiver is near a strong signal level and the antenna receives the signal. The signal is then amplified by a Radio Frequency Amplifier (RF-AMP) based on the control signal from the RF-AGC and results in a low gain. Thus, the receiver cannot detect the station corresponding to the current field strength level because of the decrease in the gain caused by the RF-AGC.

Japanese laid-open publication number Hei 6-13921 suggested an improvement to the "miss-stop" problem. In a receiver based on the Hei 6-13921, when the auto search operation with a receiver (an AM receiver) is started, the receiver decreases the sensitivity of the RF-AGC circuit as compared to a normal operation. As a result, a gain of the RF-AMP during the auto search operation is decreased as compared with the gain in the normal operation. So, it is possible for the station detector to properly detect stations in a strong reception level area. However, this type of receiver also has a problem caused by changing the sensitivity of the RF-AGC circuit and results in another type of "miss-stop," where a receiver picks up a station even though no such station exists.

In a receiver based on the Hei 6-13921, the "miss-stop" occurs because the RF-AMP uses a transistor as an amplifier device. A transistor as an amplifier device makes harmonics based on non-liner characteristics, such as square characteristics, when the transistor receives a strong signal level. This results in the second or the third harmonics being detected as a station. Thus, when one of the harmonics is higher than the reference level set in the receiver, the search circuit detects it as a real station.

SUMMARY OF THE INVENTION

Accordingly, the present invention is directed to a receiver with a search circuit that substantially obviates one or more of the problems due to limitations and disadvantages of the related art.

An object of the present invention is to detect a station correctly during a search operation without being influenced by any reception conditions.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

To achieve the objects and in accordance with the purpose of the invention, as embodied and broadly described herein, the receiver includes a RF-AGC circuit for gain control of a RF-AMP and for generating a control signal according to an output signal of the RF-AMP; a search circuit including a reception condition detector for generating the reception condition signal based on the output signal of a RF-AMP; a sensitivity change circuit for receiving the control signal from a RF-AGC Circuit and for changing the sensitivity of the search circuit so as to compensate a loss of the reception condition signal caused by the RF-AGC circuit; and a station detector for outputting a station detection signal based on a reception condition signal and reference signal.

In another aspect, the receiver includes a RF-AGC circuit, which outputs a first control signal, corresponding to an output signal of an RF-AMP, to control the output of the RF-AMP; and a second control signal, corresponding to an output signal of the RF-AMP, to a sensitivity change circuit; a search circuit including a reception condition detector for generating a reception condition signal according to the output signals of the RF-AMP; a sensitivity change circuit for adjusting the sensitivity of the search circuit according to the second control signal so that the loss in the reception condition signal caused by the RF-AGC circuit is compensated; and a station detector for generating a station detection signal based on a reception condition signal and a reference signal.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are incorporated in and constitute a part of this specification, illustrate several embodiments of the invention and together with the description, serve to explain the principles of the invention. In the drawings.

DESCRIPTION OF THE PREFERRED EMBODIMENTS

Reference will now be made in detail to the preferred embodiments of the present invention, examples of which are illustrated in the accompanying drawings. Wherever possible, the same reference numbers will be used throughout the drawings to refer to the same or like parts.

Figure 1:
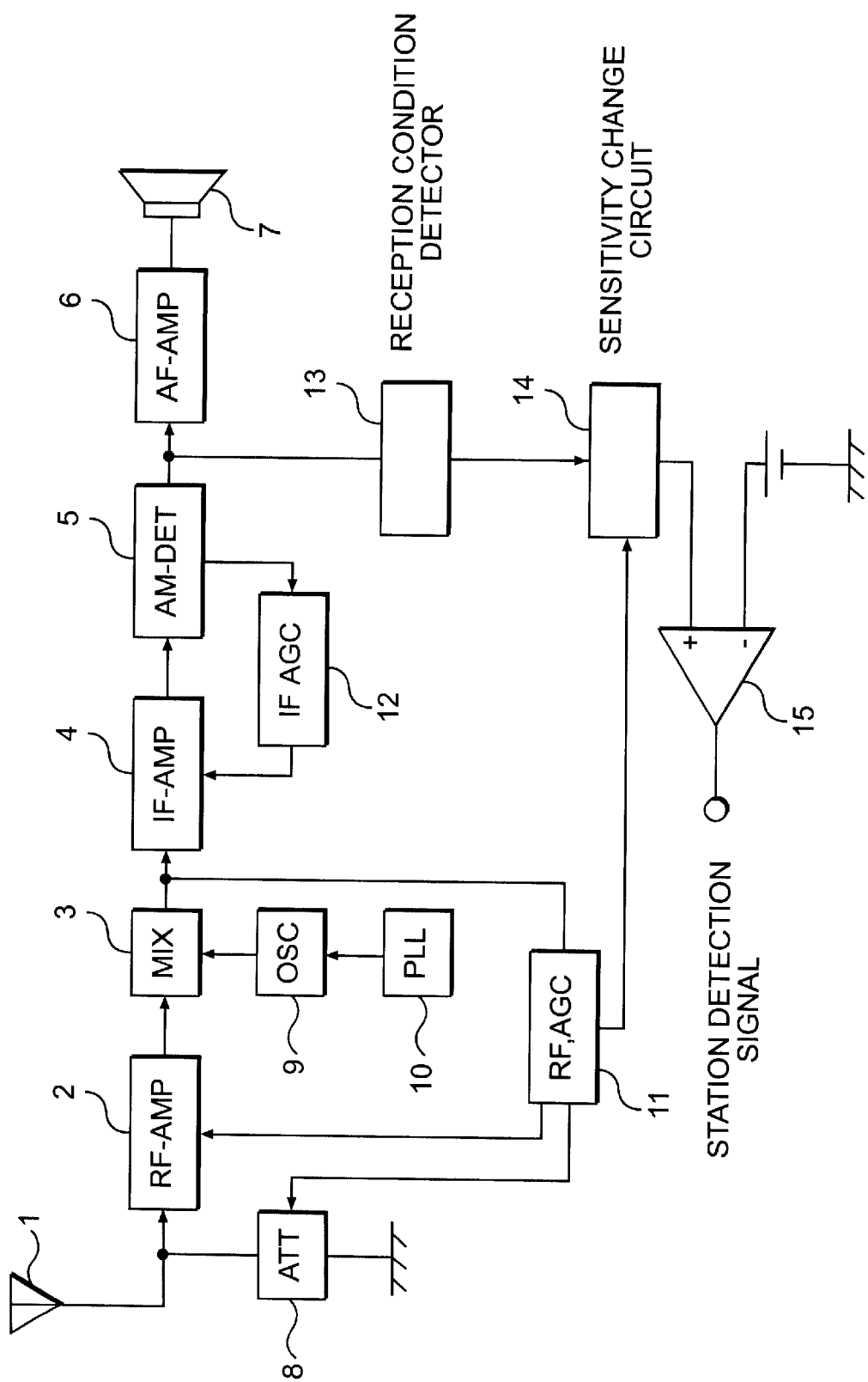
FIG. 1 is a block diagram of an AM receiver with a search circuit in accordance with an embodiment of the present invention.

In accordance with the invention, FIG. 1 is a block diagram of an AM receiver, which comprises an antenna 1, a RF-AMP 2, a mixer 3, an intermediate frequency amplifier (IF-AMP) 4, an Amplitude Modulation detector (AM-DET) 5, an audio frequency amplifier (AF-AMP) 6, a speaker 7, an attenuator 8, an oscillator 9, a PLL (phased lock loop) circuit 10, a RF-AGC circuit 11, and an IF-AGC circuit 12. In addition, the receiver consists of a search circuit that includes a reception condition detector 13, a sensitivity change circuit 14, and a station detector, The station detector includes the comparator 15. The operation of the whole receiver will be described next followed by a description of the search circuit.

The operation of the AM-receiver shown in FIG. 1 begins with antenna 1. Antenna 1 receives a signal corresponding to an AM broadcasting program. Then, the RF-AMP 2 amplifies the signal based on a control signal received from the RF-AGC circuit 11. The RF-AGC circuit 11 also controls the attenuator 8. So, the RF-AGC circuit 11 controls the output signal level of the RF-AMP 2 by controlling both the RF-AMP 2 and the attenuator 8. The RF-AGC circuit 11 generates the control signal based on the output of mixer 3 and a first signal level (not shown). The RF-AGC circuit 11 makes certain that the output signal level of the RF-AMP 2 does not exceed the first signal level.

The mixer 3 is for converting an output signal of the RF-AMP 2 to an intermediate frequency (IF) signal. In detail, the PLL circuit 10 controls a frequency of the oscillator 9 so that the IF signal frequency is maintained at a specific level and the mixer 3 mixes the output signal of the oscillator 9 with the output signal of the RF-AMP 2. In addition, the mixer includes a filter to remove undesired signal components from the IF signal.

Next, the IF-AMP 4 amplifies the IF signal in accordance with a control signal outputted from the IF-AGC circuit 12. The IF-AGC circuit 12 controls the IF-AMP 4 so that the output signal of IF-AMP 4 does not exceed a second signal level (not shown).

The AM-DET 5 is then used for demodulating the output signal of the IF-AMP 4, In addition, the AM-DET 5 also generates an output signal to the AF-AMP 6 and the reception condition detector 13. The AF-AMP 6 then amplifies the audio signal and outputs the amplified signal through the speaker 7. The operation of the search circuit will be described next.

As mentioned earlier, a search circuit includes the reception condition detector 13, the sensitivity change circuit 14, and a station detector 15. The reception condition detector 13 generates a reception condition signal, a DC signal, based on the output signal, an AC signal, of the AM-DET 5. Next, the sensitivity change circuit 14 generates an output signal according to a reception condition signal supplied from the reception condition detector 13 and a control signal supplied from the RF-AGC circuit 11. The control signal from the RF-AGC circuit 11 is such that the sensitivity change circuit 14 compensates for a loss in the reception condition signal caused by the RF-AGC circuit 11. Moreover, the comparator 15, as a part of the station detector, outputs a station detection signal by comparing the output signal level of the sensitivity change circuit 14 with a reference level. This reference level is set so that it does not exceed the second signal level and thus, the IF-AGC does not have any affect on the comparison process of the station detector 15.

Figure 2:
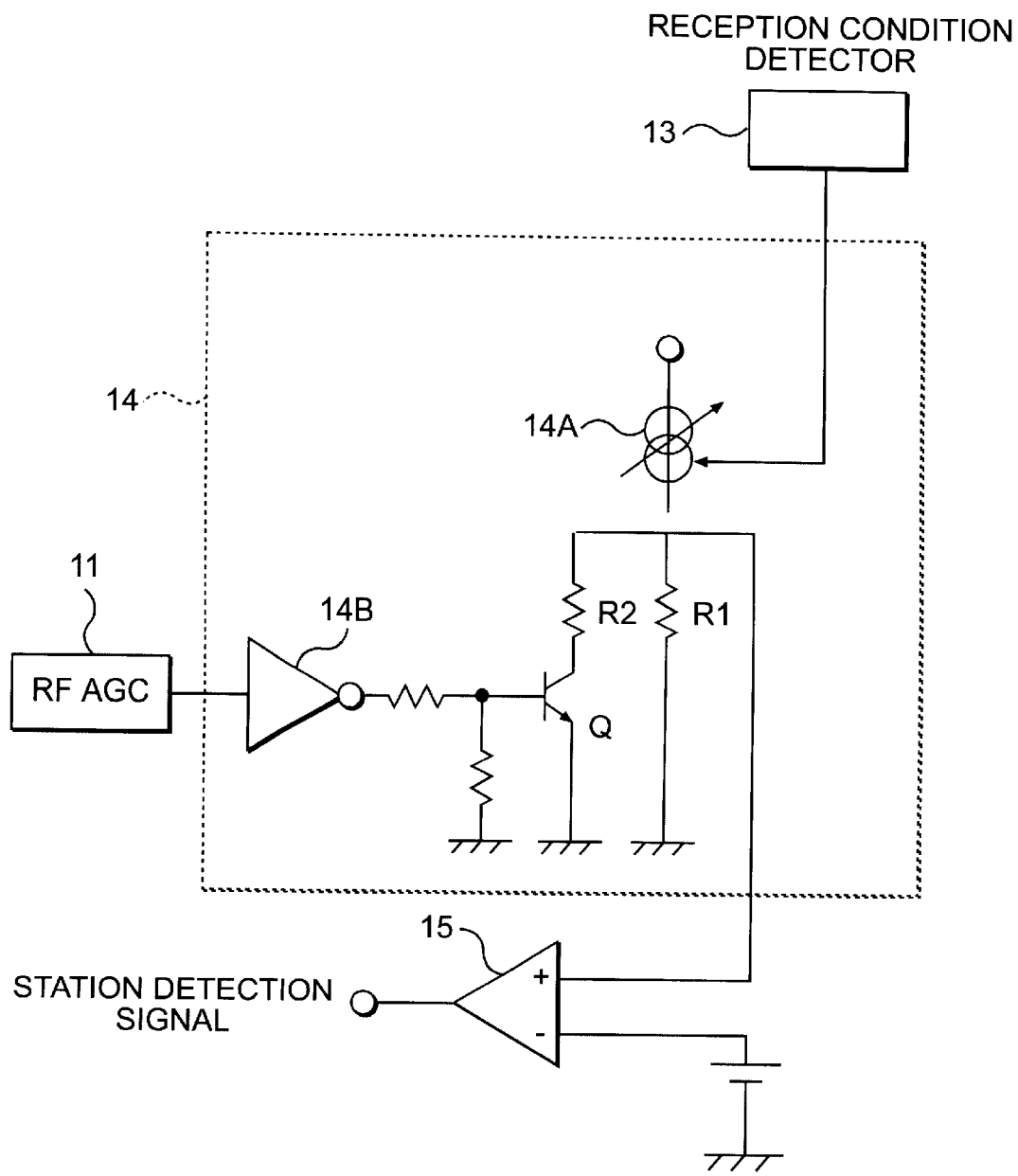
FIG. 2 is a search circuit in accordance with the embodiments of the present invention.

Referring to FIG. 2, the sensitivity change circuit 14 comprises a variable current source 14A, resistors R1 and R2, a transistor Q, and an inverter 14B. A control terminal of the variable current source 14A connects it to the reception condition detector 13. The variable current source 14A receives the reception condition signal from the reception condition detector 13 and generates an output signal (I). An output terminal of the variable current source connects to resistors R1 and R2. The other side of the resistor R1 is connected to a ground terminal. On the other hand, the other side of the resistor R2 is connected to a collector electrode of the transistor Q. The emitter electrode of transistor Q is connected to a ground terminal. The inverter 14B is arranged between the RF-AGC circuit 11 and the base electrode of the transistor Q.

The comparator 15 outputs a station detection signal in a weak as well as a strong reception area without changing the sensitivity of the RF-AGC circuit 11. When the receiver is in an area of weak reception field, the RF-AGC circuit 11 does not function. Thus, the RF-AGC circuit 11 does not output a control signal (a high level signal). As a result, the inverter 14B outputs a high level signal to the base electrode of the transistor Q. Therefore, a voltage (V) at the positive (+) terminal of the comparator 15 is given by "$V = I \cdot (R1 // R2)$." Then, the comparator 15 compares the output signal level of the sensitivity change circuit 14 with the reference level. If this output signal level is higher than the reference level, the comparator 15 outputs the station detection signal (a high level signal) to a main controller (not shown).

On the other hand, when the receiver is in an area of strong reception field, the RF-AGC circuit 11 functions and generates a control signal (a high level signal) to the inverter 14B. As a result, the inverter 14B outputs a low level signal to the base electrode of the transistor Q and transistor Q changes its state from an "On" state to an "Off" state. Therefore, the voltage (V) at the positive (+) terminal of the comparator 15 is given by "$V = I \cdot R1$." As a result of this control signal, the signal level at the positive (+) terminal of the comparator 15 increases because the resistor R1's value is bigger than a value of R1 and R2 in parallel ($R1 // R2$). Then, the comparator 15 compares the output signal level of the sensitivity change circuit 14 with the reference level. If this output signal level is higher than the reference level, comparator 15 outputs the station detection signal (a high level signal) to the main controller (not shown).

The station detection signal serves as a control signal for the receiver. For example, the station detection signal may be used as a presetting function to preset several frequencies in the memory of the receiver automatically through a search operation.

As described above, the comparator generates a station detection signal in both a weak and strong reception area. So, the sensitivity of the search circuit is adjusted to compensate a loss in the reception condition signal caused by the RF-AGC circuit 11. As a result, this receiver has a more accurate auto search circuit than a conventional receiver.

Moreover, the RF-AGC circuit 11 can hold its performance during the search operation as well as its normal operation. In particular, a gain of the RF-AMP and/or an input signal level of the RF-AMP is sufficiently decreased by an action of the RF-AGC circuit 11. Thus, an incidence of harmonics based on the nonlinear characteristics of the RF-AMP is suppressed during the search operation as against a receiver described in the Japanese laid-open application number Hei 6-13921. Therefore, a receiver of the present invention restrains possibilities of "miss-stops" during the search operation.

Figure 3:
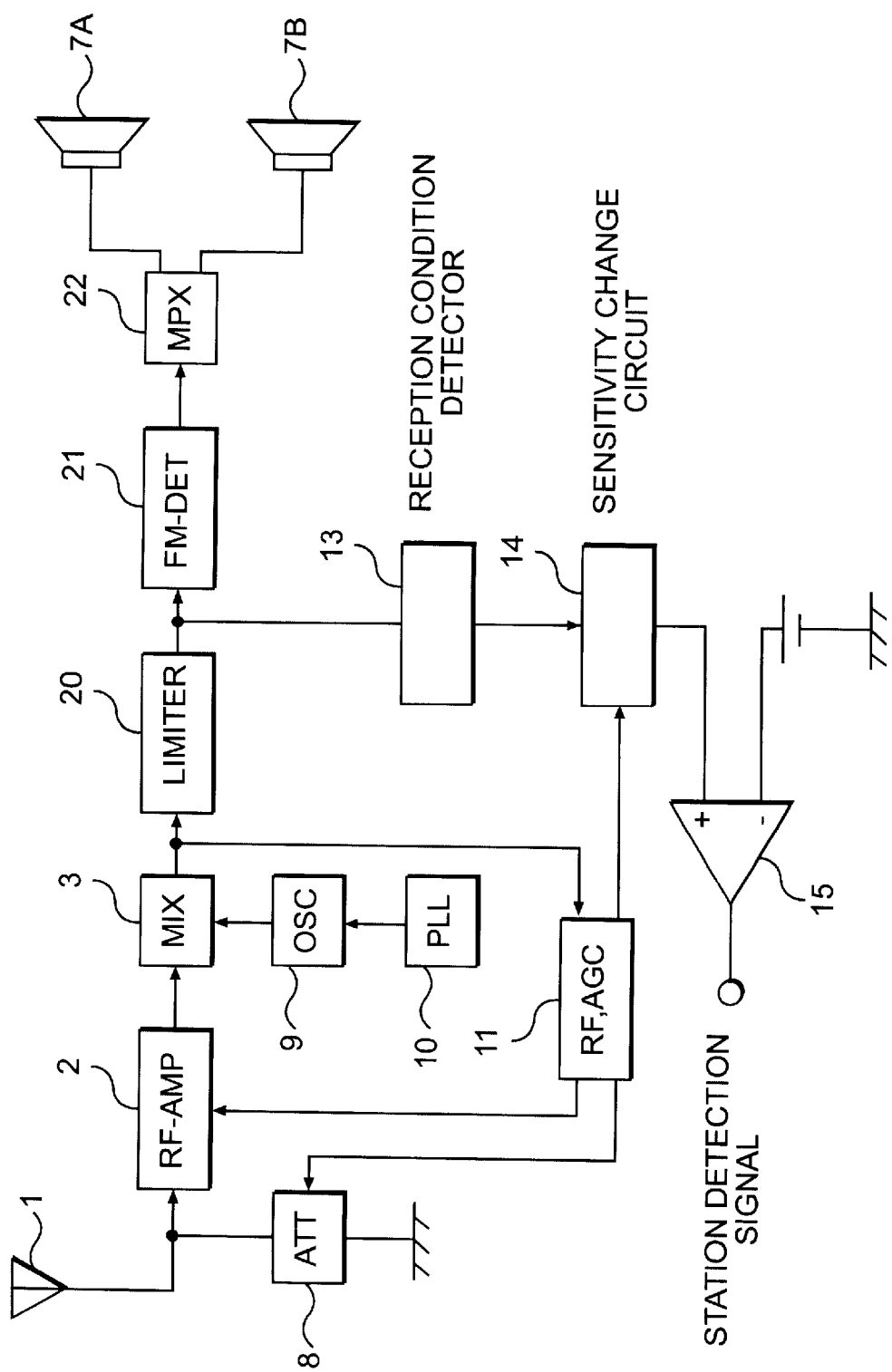
FIG. 3 is a block diagram of a FM receiver with a search circuit in accordance with another embodiment of the present invention.

In accordance with another embodiment of the invention, FIG. 3 is a block diagram of a FM receiver, which comprises an antenna 1, an RF-AMP 2, a mixer 3, a limiter 20, a Frequency modulation detector (FM-DET) 21, a multiplex demodulator (MPX) 22, speakers 7A and 7B, an attenuator 8, an oscillator 9, a PLL(phased lock loop) circuit 10 and a RF-AGC circuit 11. In addition, the receiver consists of a search circuit that includes a reception condition detector 13, a sensitivity change circuit 14, and a station detector. The station detector includes the comparator 15. The operation of the whole receiver will be described next followed by a description of the search circuit.

The operation of the FM-receiver shown in FIG. 3 begins with antenna 1. Antenna 1 receives a signal corresponding to a FM broadcasting program. Then, the RF-AMP 2 amplifies the signal based on a control signal received from the RF-AGC circuit 11. The RF-AGC circuit 11 also controls the attenuator 8. So, the RF-AGC circuit 11 controls the output signal level of the RF-AMP 2 by controlling both the RF-AMP 2 and the attenuator 8. The RF-AGC circuit 11 generates the control signal based on the output of mixer 3 and a first signal level (not shown). The RF-AGC circuit 11 makes certain that the output signal level of the RF-AMP 2 does not exceed the first signal level.

The mixer 3 is for converting an output signal of the RF-AMP 2 to an intermediate frequency (IF) signal. In detail, the PLL circuit 10 controls a frequency of the oscillator 9 so that the IF signal frequency is maintained at a specific level and the mixer 3 mixes the output signal of the oscillator 9 with the output signal of the RF-AMP 2. In addition, the mixer includes a filter to remove the undesired signal components from the IF signal. Next, the limiter 20 amplifies the IF signal.

The amplified signal from the limiter 20 is then used as input for the FM-DET 21 and the reception condition detector 13. The FM detector 21 demodulates an output signal of the limiter 20 and outputs a composite signal to the multiplex demodulator (MPX) 22. The MPX 22 then demodulates the composite signal and produces a stereo audio signal. The MPX 22 includes an amplifier to amplify the stereo audio signal. Finally, the signals of the MPX 22 are outputted through speakers 7A and 7B.

As mentioned earlier, a search circuit includes the reception condition detector 13, the sensitivity change circuit 14, and a station detector 15. The reception condition detector 13 generates a reception condition signal based on the output signal of the limiter 20. The sensitivity change circuit 14 is composed of the same components as shown in FIG. 2 and described earlier. Therefore, the sensitivity of the search circuit is adjusted to compensate a loss in the reception condition signal caused by the RF-AGC circuit 11. Thus, this FM receiver's station detector 15 outputs a more accurate station detection signal than a conventional receiver and reduces the possibility of "miss-stops."

In the embodiments mentioned above, the sensitivity change circuit 14 modifies the reception condition signal from the reception condition detector 13. However, the present invention is not limited thereto. Instead of the reception condition signal, the sensitivity change circuit 14 may change the reference level of the comparator 15.

It will be apparent to those skilled in the art that various modifications and variations can be made in the receiver with a search circuit of the present invention without departing from the spirit or scope of the invention. Thus, it is intended that the present invention covers the modifications and variations of this invention provided they come within the scope of the appended claims and their equivalents.

What is claimed is:

1. A receiver comprising:
   a RF-AGC circuit for gain control of a RF-AMP and for generating a control signal according to an output signal of the RF-AMP;
   a search circuit including a reception condition detector for generating the reception condition signal based on the output signal of a RF-AMP; a sensitivity change circuit for receiving the control signal from a RF-AGC circuit and for changing the sensitivity of the search circuit so as to compensate a loss of the reception condition signal caused by the RF-AGC circuit; and a station detector for outputting a station detection signal based on a reception condition signal and a reference signal.

2. The receiver according to claim 1, wherein the sensitivity change circuit generates a modified reception condition signal based on both the reception condition signal and the control signal; and the station detector generates the station detection signal comparing the modified reception condition signal with a reference signal.

3. A receiver, comprising:
   a RF-AGC circuit, which outputs a first control signal, corresponding to an output signal of an RF-AMP, to control the output of the RF-AMP; and a second control signal, corresponding to an output signal of the RF-AMP, to a sensitivity change circuit;
   a search circuit including a reception condition detector for generating a reception condition signal according to the output signals of the RF-AMP; a sensitivity change circuit for adjusting the sensitivity of the search circuit according to the second control signal so that the loss in the reception condition signal caused by the RF-AGC circuit is compensated; and a station detector for generating a station detection signal based on a reception condition signal and a reference signal.

4. The receiver according to claim 3, wherein the sensitivity change circuit generates a modified reception condition signal, based on the reception condition signal and the second control signal, to a comparator of the station detector; and the station detector generates a station detection signal comparing the modified reception condition signal with a reference signal.

5. The receiver according to claim 3, wherein the receiver further comprises an attenuator arranged in front of the RF-AMP; and the RF-AGC circuit generates a third control signal, corresponding to the output signal of the RF-AMP, to the attenuator.

6. The receiver according to claim 3, wherein the receiver further comprises a mixer arranged between the RF-AMP and the RF-AGC circuit; the RF-AGC circuit generates the first and second control signals- based on an output signal of the mixer; and the reception condition detector generates the reception condition signal according to the output signal of the mixer.

7. A receiver, comprising:

a RF-AGC circuit, which outputs a first control signal, corresponding to an output signal of an RF-AMP, to control the output of the RF-AMP; and a second control signal, corresponding to an output signal of the RF-AMP, to a sensitivity change circuit, wherein the second control signal has two states: a high level and a low level; and the RF-AGC circuit generates one of the two states according to the output signal of the RF-AMP; and a search circuit including a reception condition detector for generating a reception condition signal according to the output signals of the RF-AMP; a sensitivity change circuit for adjusting the sensitivity of the search circuit according to the second control signal so that the loss in the reception condition signal caused by the RF-AGC circuit is compensated; and a station detector for generating a station detection signal based on a reception condition signal and a reference signal.

* * * * *